United States Patent [19]

Haacke

[11] Patent Number: 4,716,368
[45] Date of Patent: Dec. 29, 1987

[54] MAGNETIC RESONANCE RECONSTRUCTION AND SCANNING TECHNIQUES USING KNOWN INFORMATION, CONSTRAINTS, AND SYMMETRY RELATIONS

[75] Inventor: E. Mark Haacke, University Heights, Ohio

[73] Assignee: Picker International, Inc., Highland Hts., Ohio

[21] Appl. No.: 782,075

[22] Filed: Sep. 30, 1985

Related U.S. Application Data

[63] Continuation-in-part of Ser. No. 764,439, Aug. 9, 1985, which is a continuation-in-part of Ser. No. 731,509, May 7, 1985, Pat. No. 4,678,996.

[51] Int. Cl.$^4$ .............................................. G01R 33/20
[52] U.S. Cl. .................................... 324/309; 324/308
[58] Field of Search ................ 324/300, 308, 309, 310, 324/311, 312, 313; 128/653

[56] References Cited

U.S. PATENT DOCUMENTS

| | | | |
|---|---|---|---|
| 4,303,077 | 12/1981 | Lewin et al. | 128/777 |
| 4,361,807 | 11/1982 | Barl et al. | 324/309 |
| 4,574,240 | 3/1986 | Libove et al. | 324/309 |
| 4,581,582 | 4/1986 | Redington | 324/308 |
| 4,591,789 | 5/1986 | Glover et al. | 324/309 |
| 4,613,819 | 9/1986 | Chui | 324/308 |
| 4,616,183 | 10/1986 | Glover et al. | 324/309 |
| 4,618,826 | 10/1986 | Smith et al. | 324/308 |

FOREIGN PATENT DOCUMENTS

| | | |
|---|---|---|
| 0042256 | 12/1981 | European Pat. Off. . |
| 0086487 | 12/1983 | European Pat. Off. . |
| 0105220 | 4/1984 | European Pat. Off. . |
| 0122593 | 10/1984 | European Pat. Off. . |
| 0146873 | 7/1985 | European Pat. Off. . |
| 0152069 | 8/1985 | European Pat. Off. . |
| 2854774 | 7/1980 | Fed. Rep. of Germany . |
| 2027208 | 2/1980 | United Kingdom . |
| 2157832 | 10/1985 | United Kingdom . |

OTHER PUBLICATIONS

"Respiratory Gating in Magnetic Resonance Imaging at 0.5 Tesla" V. M. Runge Radiology, v. 151, pp. 521–523 (1984).
Patent Abstracts of Japan, vol. 7, No. 142(P-205)(1287), Jun. 22, 1984 and JP, A, 5855741.
Patent Abstracts of Japan, vol. 6, No. 145(P-132)(1023), Aug. 4, 1982, and JP, A. 5766346.

*Primary Examiner*—Michael J. Tokar
*Attorney, Agent, or Firm*—Fay, Sharpe, Beall, Fagan, Minnich & McKee

[57] ABSTRACT

A reference object (24) is disposed in an image region (20) with a subject (22) to be examined. The reference object has known parameters such as relaxation time, spin density, dimensions, and position. Magnetic resonance signals in which the spatial position of resonating nuclei is encoded in the relative phase and frequency thereof are sampled and temporarily stored in a view memory (56). A Fourier transform (60) is performed to convert the stored signals view into a representation of at least the positions and spin density of the resonating magnetic dipoles of the subject and reference object. The parameters of the reference object measured from the image representation are compared or inverse transformed back to data space for comparison with actual parameters of the reference object or thresholds. Based on the comparison, the resonance signals or the image representation are adjusted. For example, the magnetic resonance signals are rotated (78) through a phase correction to correct for offsets in the phase encoding. As other examples, the spin density may be adjusted, low magnitude data discarded, spatially offset data shifted, or the like. Alternately, the reference object may be interconnected with the subject to undergo movement therewith. The position of the reference object is then utilized to select views in which the movement of the subject is within preselected ranges or to approximately correct for the motion. The image can be shifted to a selected location or interpolated.

8 Claims, 4 Drawing Figures

MAGNETIC RESONANCE RECONSTRUCTION AND SCANNING TECHNIQUES USING KNOWN INFORMATION, CONSTRAINTS, AND SYMMETRY RELATIONS

This application is a continuation in part of application Ser. No. 764,439, filed Aug. 9, 1985, which in turn is a continuation in part of application Ser. No. 731,509, May 7, 1985, and now U.S. Pat. No. 4,678,996.

BACKGROUND OF THE INVENTION

The present invention relates to the magnetic resonance examination art. It finds particular application in conjunction with the reconstruction of images of examined regions of patients and will be described with particular reference thereto. However, it is to be appreciated that the invention may find further application in the imaging of other objects, in other types of magnetic resonance examinations, in other imaging modalities, and the like.

Heretofore, magnetic resonance imaging included positioning the patient in a strong, substantially uniform, longitudinal magnetic field. Magnetic dipoles were caused to precess generating magnetic resonance signals. Various known techniques were utilized to select a region of the patient to be imaged and to spatially encode the resonance signals therefrom. In one technique, the resonance excitation was limited to the region of interest. Othogonal magnetic field gradients were applied across the selected image region to provide a two dimensional spatial encoding, which encoding was carried by the frequency and phase of the resonance signal. The resonance signals were transformed from a frequency and phase domain to a spatial domain to produce an image representing the density of resonanting nuclei in each pixel or incremental area of the image region. The accuracy with which an image could be reconstructed was limited by the accuracy of the phase and frequency encoding.

The magnetic field gradients commonly altered the frequency of the magnetic resonance signal as a function of spatial position. More specifically, the read gradient altered the resonance frequency of at least three megahertz linearly by about 30 hertz for each millimeter in the selected direction. Thus, when utilizing one millimeter pixels, a random frequency fluctuation of merely one thousandth of one percent shifted the encoding by a full pixel, thus degrading the image. Variations in the strength of the magnetic field caused corresponding fluctuations in the frequency of the resonance signal. although, hardware solutions have been provided for improving the magnetic field uniformity and otherwise limiting frequency fluctuations, such hardware solutions commonly were only able to limit the frequency fluctuations to about 50 hertz over a five minute interval. Although a very small percentage variation, significant image degradation was caused.

The second spatial direction was commonly encoded with the phase of the magnetic resonance signal. The phase was encoded by the application of a second magnetic field gradient, commonly transverse to the first magnetic field gradient. Because the accuracy of the phase encoding again varied with the accuracy with which the magnetic field and resonance frequencies were maintained, analogous image degradation was caused by the inability to hold the phase encoding more precisely.

Commonly, the final magnetic resonance image was a compilation or sum of a plurality of views, each view having been taken with a different phase or frequency encoding. From time to time, one or more of the views which was combined to form the image include badly degraded or otherwise undesirable data. In the prior art, the effect of this bad data was lessened by averaging a large number of views. However, no technique was provided for removing or correcting individual bad views or bad points.

Another problem encountered in the prior art resided in the standardization of the image. In particular, the resonance signals in each view tended to vary from each other. Thus, some views were unintentionally weighted more heavily than others during the summing, again causing image degradation.

Yet another problem resided in the accuracy with which the phase encoding could be maintained from view to view. Commonly, there was a phase shift error between views, which error again lead to image degradation.

Another source of image degradation was attributable to movement in the image region. For example, respiratory or cardiac movement of the patient caused severe image degradation in the resultant image. Respiratory and cardiac gating apparatae were used to limit the collection of the views substantially to the same portion of the respiratory or cardiac cycle. However, such cardiac and respiratory gating increased scan time and still suffered from motion artifacts, especially for multi-slice imaging.

The present invention provides a new and improved magnetic resonance imaging technique which overcomes the above referenced problems and others to provide magnetic resonance images of greater accuracy and with reduced artifacts.

SUMMARY OF THE INVENTION

In accordance with one aspect of the present invention, a method of magnetic resonance imaging is provided. A subject to be imaged and a reference are both positioned in an image region. The reference has known values for at least one of a preselected set of parameters, such as relaxation time, spin density, dimensions, and position within the image region. Resonance is excited in magnetic dipoles of at least the portion of the subject and reference object which are disposed in the image region. Magnetic field gradients are caused across the uniform magnetic field in the image region for encoding the spatial positions of the resonating magnetic dipoles in the frequency and phase of the resonance signal. The magnetic resonance signal from each view is received and temporarily stored. The resonance signal is transformed from a spatial frequency and phase domain to a spatial domain to reconstruct a representation of an image of at least the reference. A value corresponding to one of the reference known values is measured from the image representation to produce a measured value. The corresponding measured value and known value are compared to determine a deviation therebetween.

In accordance with a more limited aspect of the present invention, at least one of the resonance signal and the image representation are altered in accordance with the deviation between the known and measured values in such a manner that the deviation is minimized. For example, the phase of the resonance signal may be rotated by an appropriate correction phase angle, the spatial position of each pixel may be shifted in accordance with a frequency variation, the spin density may be varied to standardize a plurality of views, or the like.

In accordance with another aspect of the present invention, the deviation between the measured and known values may be compared with a preselected maximum deviation. In response to the deviation exceeding the preselected maximum, the resonance signal may be discarded and the same view taken again or, to save time, data from adjacent views interpolated to create a replacement view.

In accordance with yet another aspect of the present invention, the reference is disposed to be moved with a moving part of the patient. For example, the reference object may be disposed to move with the patient's respiratory cycle. As another example, the reference object might be a portion of the patient's heart wall which moves in conjunction with the cardiac cycle. In this manner, the spatial position of the reference varies in accordance with the motion. The deviation between the measured position of the reference and a rest or other preselected position provides an indication of the relative movement for which correction may be made.

In one embodiment, the views are sorted in accordance with the deviation such that views of substantially the same degree of movement are combined together. In this manner, a series of images may be generated, each representing a different point in the patient's respiratory or cardiac cycle. Alternately, each view may be triggered, accepted, discarded, or the like in accordance with the degree of movement.

In accordance with another aspect of the present invention, a magnetic resonance imaging apparatus is provided. The apparatus includes means for supporting a subject and a reference object in an image region. The reference object has a plurality of parameters, such as relaxation time, spin density, dimensions, and position within the image region. A value of at least a preselected one of the parameters is known. Magnets create a substantially uniform main magnetic field through the image region. Resonance excitation means excite magnetic dipoles in at least the image region to precess, generating a magnetic resonance signal. Magnetic gradient means selectively cause magnetic field gradients across the image region to encode spatial position of the resonating dipoles in the frequency and phase of the resonance signal. A receiving means receives the resonance signal from the resonating nuclei and stores each resonance signal in a memory means. An image reconstruction means reconstructs a representation of at least the reference object from the resonance signal stored in the memory means and stores the representation in an intermediate memory means. A measuring means measures a value of the preselected parameter from the image representation in the intermediate image memory to obtain a measured parameter value. A comparing means compares the measured and known values to determine a deviation therebetween.

In accordance with a more limited aspect of the present invention, the apparatus further includes an altering means for altering at least one of the stored resonant signals and the image representation in the intermediate image memory in such a manner that the deviation between the known and measured parameter values is minimized.

In accordance with another more limited aspect of the present invention, the reference object is disposed to move with a moving portion of the subject in the image region. The magnetic resonance apparatus further includes a position determining means for determining the position of the referenced object from the image representation in the intermediate image memory.

A first advantage of the present invention resides in the correction of magnetic resonance data.

Another advantage of the present invention is that it enables patient motion to be monitored.

Another advantage is the more precise reconstruction of image representations.

Still further advantages of the present invention will become apparent to those of ordinary skill in the art upon reading and understanding the following detailed description of the preferred embodiments.

BRIEF DESCRIPTION OF THE DRAWINGS

The invention may be embodied in various parts and arrangements of parts or in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1A:
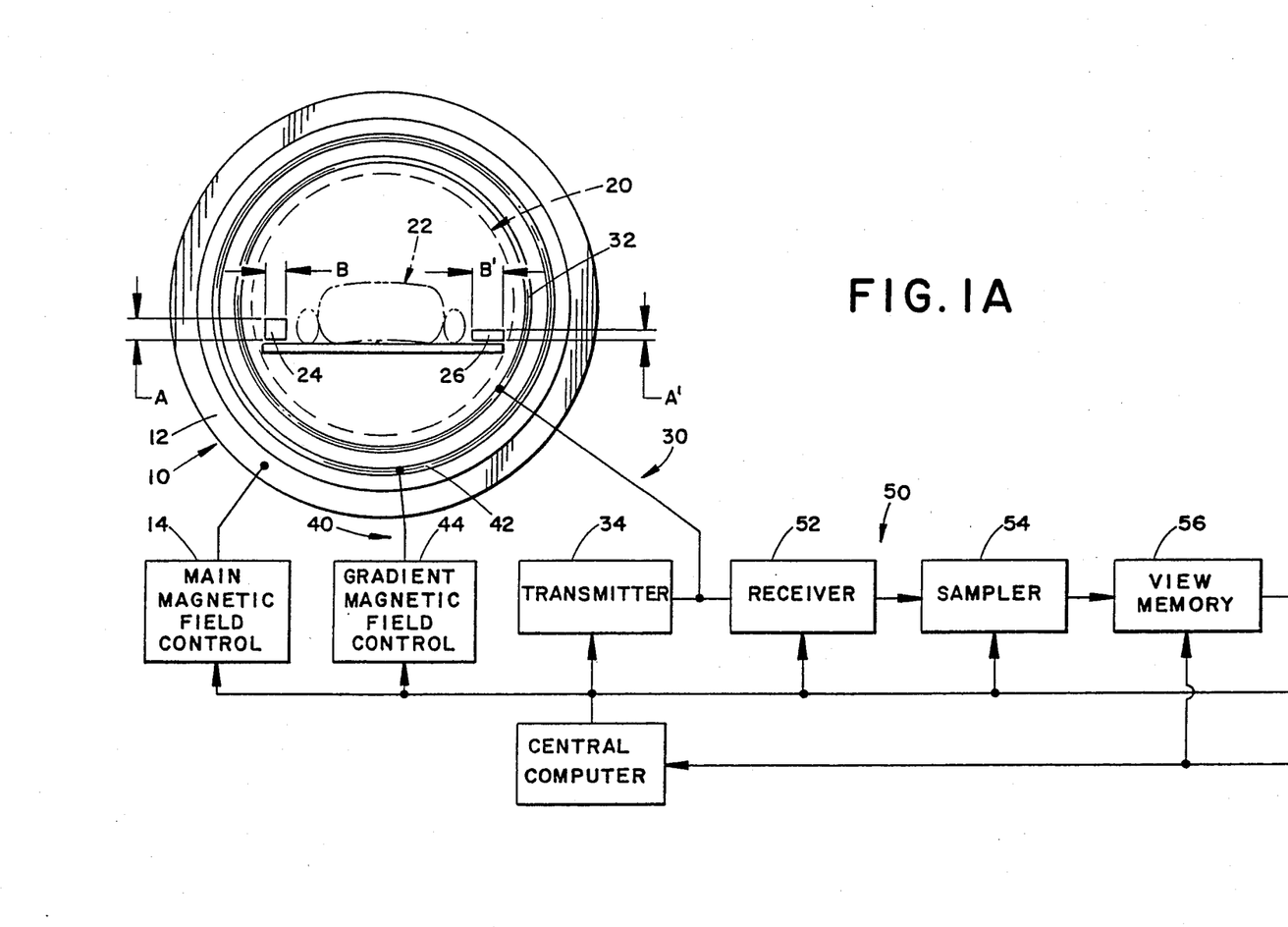
FIG. 1A and 1B taken together provide a diagrammatic illustration of a magnetic resonance imaging apparatus in accordance with the present invention; and, FIG. 2A and 2B provide a diagrammatic illustration of a magnetic resonance imaging apparatus for monitoring patient motion in accordance with the present invention.
Figure 1B:
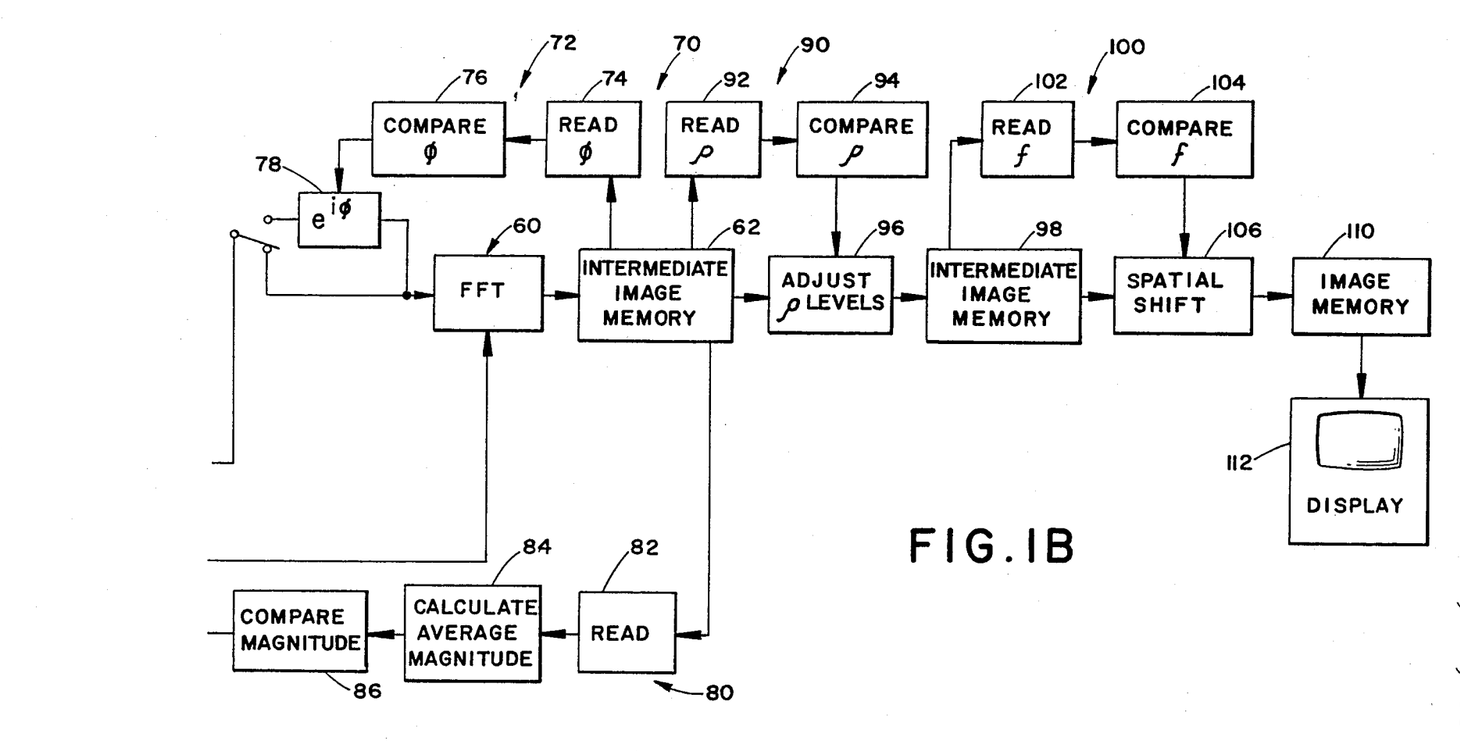

With reference to FIG. 1A and B, a main magnetic field generating means 10 generates a strong, generally uniform main magnetic field which extends generally longitudinally through an image region 20 in which a sample and reference are disposed. A resonance excitation means 30 selectively excites magnetic dipoles of nuclei in the image region to precess about the main magnetic field. Each precessing magnetic dipole generates a component of a resonance signal. A gradient field means 40 selectively causes gradients across the main magnetic field in the image region at selectable orientations. The gradient magnetic fields spatially encode the resonance signal components transmitted by resonating magnetic dipoles within the image region. Specific to the preferred embodiment, the frequency and relative phase of each component is encoded in accordance with the spatial location of the corresponding generating dipole.

A sampling means 50 discretely samples and stores an integral number of data points of each received resonance signal. A transform means 60 transforms or maps each resonance signal from data space or the phase/Frequency domain into a view or image representation in image space or the spatial domain.

After each view is sampled and reconstructed in image space, an image calibration means 70 measures a parameter of the reference from the reconstructed image representation and determines a deviation between a known and the measured parameter values. The parameters may include relaxation time, spin density, dimensions, position, and the like. In accordance with the comparison, at least one of the received resonance data and the image representation is altered so as to minimize the deviation. For example, the data may be shifted or interpolated to correct for motion. Alternately, the data may be discarded and resampled or approximated from adjoining views. The improved image may be displayed or stored on a tape, disc, or other memory for later retrieval and processing.

The main magnetic field means 10 includes a plurality of annular superconducting or fluid cooled high power magnets 12 for generating the main magnetic field generally axially therethrough. A main magnetic field control circuit 14 controls and applies appropriate electric power to the annular magnets such that a substantially uniform constant magnetic field is generated longitudinally therethrough. However, small variations in the applied voltage commonly occur causing corresponding variations in the main magnetic field. Because the frequency of the generated resonance signal varies as a function of the magnetic field strength, variations in the voltage cause corresponding variations in the frequency of the resonance signal. Commonly, the main magnetic field generated by a high power magnet is only maintained with sufficient accuracy that the resonance signal, which has a frequency in the 1-200 megahertz range, tends to vary as much as 50 hertz over a period of five minutes. However, as discussed above, with each one millimeter pixel being defined by a 30 hertz frequency difference, a 50 hertz random variation among the views causes significant image degradation.

A subject 22 is supported in the image region 20 for examination. A first reference object 24 is disposed in the image region adjacent the subject but offset in the read direction. The read direction offset enables the subject signal to be deconvolved from the signal of the reference object. Preferably, a second reference object 26 is provided, with different dimensions from the first reference object. The objects are elongated along the axial direction of the magnets to accomodate the imaging of multiple slices. If the reconstructed view of one reference object is less precise than the other, view correction may be based on the more precisely imaged reference object. More particular to the preferred embodiment, the size of the reference object is selected such that the signal in the read direction is nearly flat near the echo and in the phase encoding direction rapidly changes near zero phase encoding. This condition is met when the read direction dimension of the reference object is an integral multiple of the field of view divided by the number of samples.

The excitation means 30 includes a coil 32 which is connected with a radio frequency transmitter 34 for broadcasting radio frequency excitation pulses. The radio frequency pulses are of the appropriate timing and duration, as is known in the art, to cause precession of the magnetic dipoles about the main magnetic field. In the illustrated embodiment, coil 32 functions between excitation pulses as an antenna for receiving radio frequency resonance signals. Optionally, a separate pick up coil assembly may be provided.

The gradient field means 40 includes gradient field coils 42 which surround the image region for selectively applying gradient magnetic fields transversely across the main magnetic field. A gradient magnetic field control circuit 44 controls the angular orientation with which the gradient fields are applied and the relative timing between the application of othogonal gradient pulses. More specific to the preferred embodiment, the gradient control circuit controls and selects phase and frequency encoding of the resonance signal components such that spatial position along one axis is encoded in the frequency and spatial position along an orthogonal axis is encoded in the phase. The exact sequence and timing between resonance excitation transmission and application of the gradient fields will vary in accordance with the imaging technique selected. Although the preferred embodiment is described in conjunction with spin-echo two dimensional Fourier transform imaging, it is to be appreciated that the apparatus is equally applicable to hybrid imaging, echo planar imaging, projection reconstruction imaging, inversion recovery, saturation recovery, and other imaging techniques.

The sampling means 50 includes a receiver 52 which receives the analog resonance signal which includes a large multiplicity of superimposed resonance signal components. The frequency and relative phase of each component is indicative of the encoded spatial position of the corresponding generating dipole. A digital sampling circuit 54 discretely samples each received resonance signal to generate one view of digital data for storage in a view memory means 56. After each view of the resonance data is collected and stored in the view memory means 56, the gradient magnetic field control alters the applied gradients so as to alter at least one of the frequency and phase encoding and the angular orientation thereof. The view data is transformed or mapped by a fast Fourier transform or other appropriate transform or reconstructing means 60 from the frequency and phase domain into a two dimensional spatial domain image representation. The spatial domain image representation is stored in an intermediate image memory 62.

The image calibration means 70 includes a phase angle encoding correction or adjustment means 72. A phase angle reading or measuring means 74 reads or derives a value from the image representation which is indicative of phase. Specific to the preferred embodiment, the reading means reads or determines the position of a preselected element or elements of at least one reference object, such as an edge or the central region of the reference object in the read direction for all views. A phase angle comparing means 76 compares the phase of the preselected incremental element or elements as reconstructed in the intermediate image memory with the actual phase of a reference view as determined by actual measurement, or the like. The deviation between the reconstructed and references phases is cured by shifting the phase of the resonance data by a corresponding amount. To this end, a phase shift means 78 multiplies the received image data by a phase correction value, $e^{i\phi}$. The position of the preselected incremental element as reconstructed with the phase shifted data is read by the phase angle read means 74 and compared by the phase comparing means 76 to determine whether further phase adjustment is required. This process is repeated for each view. In this manner, the phase of the resonance data is rotated for each view until correspondence between the reconstructed and reference phases of the incremental element are optimized.

An unacceptable data rejecting means 80 reads the magnitude of a plurality of pixels of the reconstructed image representation in the intermediate image memory 62. A magnitude averaging means 84 averages the magnitudes to provide an indication of the strength or magnitude of the received signal. The average magnitude is compared by a magnitude comparing means 86 with a preselected minimum magnitude. If the magnitude fails to exceed the preselected minimum, indicating weak data signals of questionable reliability, the magnitude comparing means causes the same view to be collected again. Optionally, data from adjacent views can be interpolated to replace the defective data.

An image standardization means 90 standardizes the images from view to view. In particular, the resultant spin density is adjusted such that the spin density of the reconstructed image representation is standardized in each view. In particular, the spin density is adjusted for both a deviation in the spin densities from view to view, a deviation in the longitudinal and transverse relaxation times, and deviations in other system constants which contribute to the spin density number. In the illustrated embodiment, a spin density reading means 92 reads the spin density at one or more preselected pixels disposed within the reference object. A spin density comparing means 94 compares each read spin density with a known spin density of a corresponding element of the reference object. A spin density adjusting means 96 adjusts the spin density of the data in all pixels of the intermediate image memory to create a spin density standardized image representation for storage in a second intermediate image memory means 98.

A frequency shift correcting means 100 corrects the reconstructed image data for spatial shifts in the frequency encoding direction. In particular, a read means 102 reads the location in the frequency encoding direction at which a preselected incremental element of the reference object, such as an edge, is disposed in the reconstructed image representation. A comparing means 104 compares the read reconstructed position with the actual position of the corresponding incremental element. A spatial shift means 106 adds a spatial offset to each pixel of the reconstructed image representation in the second intermediate image memory means. This shifts the spatial position of the reconstructed image to bring the reconstructed and the actual positions into coincidence. Further, this correction may be in the form of an interpolation via a model to correct for motion. That is, although the edge may have shifted, points inside the subject may be shifted by any different amounts. Hence, interpolation may be required. In this case, information from several points which do not overlap in the frequency encode direction would be desirable. Motion in any direction may be monitored.

The reconstructed image representation of each view is summed and stored in an image memory means 110 for display on a video monitor or other man-readable display 112, recording on tape or disc for later use or processing, or the like.

Figure 2A:
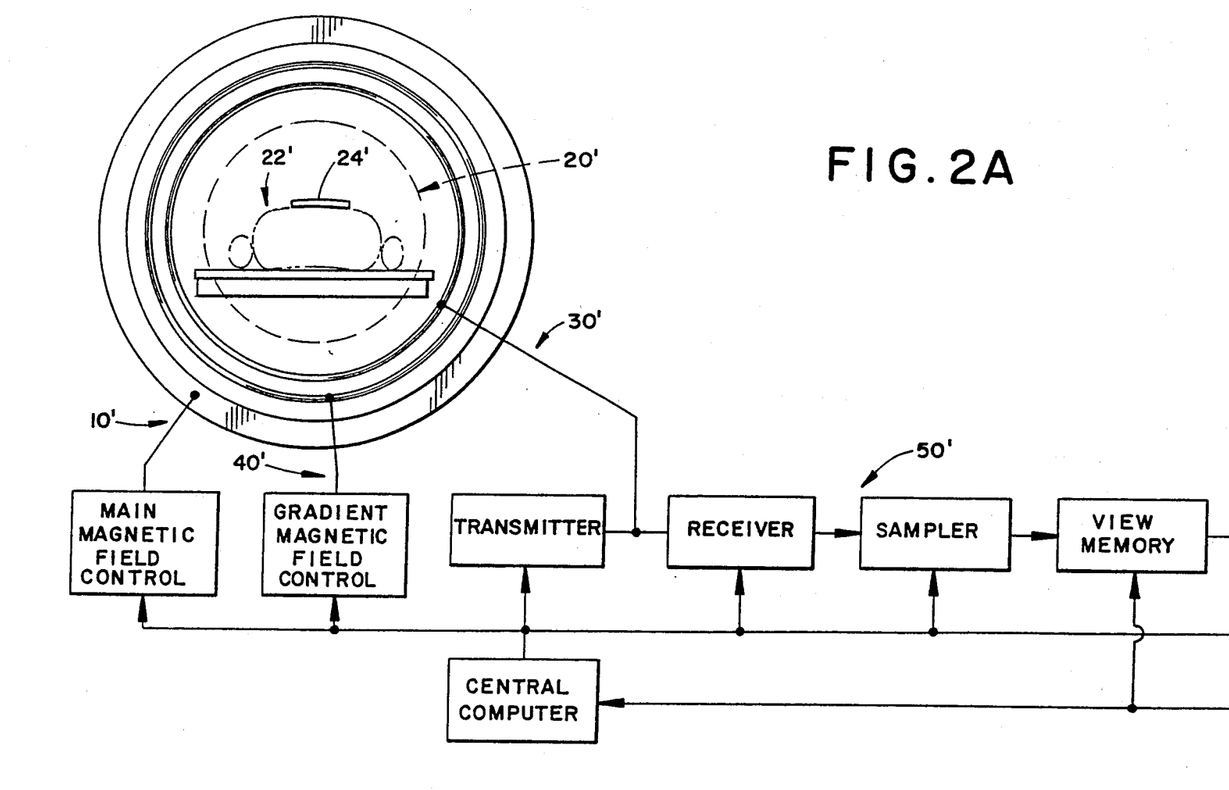

FIGS. 2A and B illustrates an alternate embodiment to the embodiment of FIGS. 1A and B which is particularly adapted for monitoring movement in the examined object. In the embodiment of FIGS. 2A and B, like elements with the embodiment of FIGS. 1A and B are denoted by the same reference numerals but followed by a prime ('). A main magnetic field means 10' causes a generally uniform and stationary magnetic field longitudinally through an image region 20'. An object to be examined 22' is disposed within the image region with a reference object 24' affixed thereto. The reference object is connected to the examined object such that it moves in coordination with the movement to be monitored or for which compensation is to be made. For example, the reference object may be attached to the patient's abdomen to monitor for respiratory movement. Alternately, the reference object may be a preselected portion of the examined object, such as an outer wall or diameterically opposed outer walls of the patient's heart. The reference object, whether a part of the examined object or a separate object, has one or more physical properties which enable its reconstructed image to be recognized and separated from the reconstruction of the other portions of the examined object.

A resonance excitation means 30' excites magnetic resonance in the examined and reference objects. A spatial position encoding means 40' encodes the spatial position of resonating nuclei. Preferrably, a frequency and phase encoding is employed, although other encoding techniques may be utilized. A receiving means 50' receives the encoded magnetic resonance signals which are transformed by a transforming means 60' into an image representation for storage in an image memory 110'. A calibration means 70' adjusts the data as described in conjunction with FIG. 1A and B to improve the quality thereof.

Figure 2B:
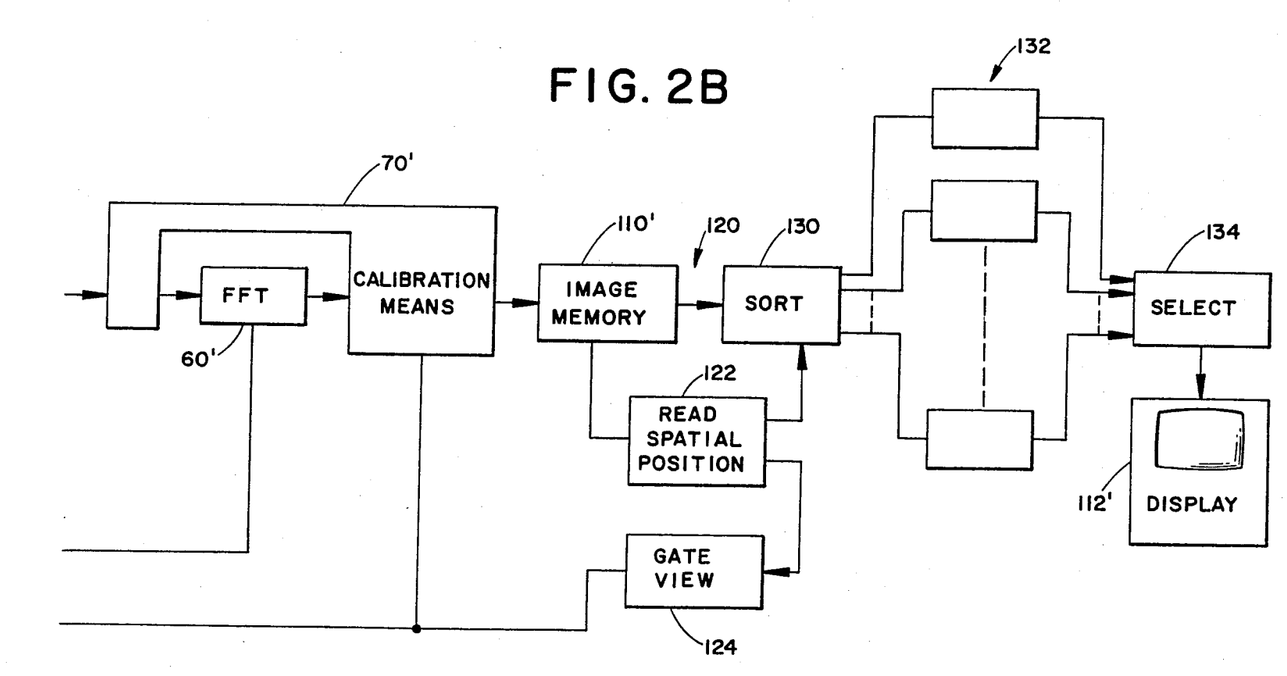

A motion determining means 120 monitors the spatial position of the reference object, hence, motion of the examined object. In particular, a spatial position reading means 122 reads the spatial position of the reference object represented in the stored image representation. In one embodiment, a scan gating means 124 causes scans to be gated in accordance with the movement of the reference object. Optionally, views taken during unacceptable movement are discarded and retaken.

As another option, a sorting means 130 sorts the views as a function of the monitored movement. Each view image representation is added with other views of the like reference object position in a corresponding memory 132. In this manner, data may be collected continuously and sorted by the relative phase of the cardiac cycle, the relative phase of the respiratory cycle, or the like. A selection means 134 selects the image of desired portion of the cardiac or respiratory cycle for display on a display means 134 selects the image of desired portion of the cardiac or respiratory cycle for display on a display means 112' or for storage on tape, disc, or the like. No monitoring hardware is required.

Although illustrated as separate components for simplicity of illustration, it is to be appreciated that the functions of the above discussed means may be performed by programs and sub-routines of an appropriately programmed computer or processor. To provide for more detailed understanding of the present invention and to assist in the programming of the appropriate algorithms when making and using the present invention, the following mathematical analysis and explanation is provided.

In the above discussed preferred embodiments, the phase and amplitude of the signal are monitored by introducing a reference object outside of the image in the frequency encoding direction. For a reference object which is A in height and B in width, i.e., along the phase encoding axis, and frequency encoding axis respectively, then the received magnetic resonance signal S is proportional to:

$$S(t, G_{pe}) = \rho_o AB \text{ sinc } (\pi \gamma t_{pe} G_{pe} A) \text{ sinc } (\pi \gamma t G_r B). \quad (1)$$

where $\gamma$ is measured in Hz/G, pe refers to phase encoding, r to read, and $\rho_o$ as the spin density of the reference object. This signal is superimposed on the other image data. However, due to the linearity and the placement of the strips outside of the main object in the read direction, the signal from the reference object can be isolated after performing an inverse Fourier transform in the x domain. The resultant signal is then expressed as:

$$S(x, G_{pe}) = \rho_o A \text{ sinc } (\pi \gamma t_{pe} G_{pe} A) \quad (2)$$

In Equations (1) and (2), the reference object is centered at the origin. If the reference object is shifted from the origin to a position $(x_1, y_1)$, then the expression for the shifted signal S becomes:

$$S_t(t, G_{pe}) = e^{-i2\pi\gamma(tpeG_ey1+tGtx1)} S(t, G_{pe}) \qquad (3)$$

and $$S_s(x, G_{pe}) = e^{-i2\pi\gamma tpeG_{pe}y1} S(x-x_1, G_{pe}) \qquad (4)$$

Because the views are regularly and linearly encoded, the gradient in the phase encode direction for the kth view can be defined as:

$$G_{pe} = k\Delta G \qquad (5)$$

The phase is then expressed as:

$$\phi_k = -2\pi\gamma t_{pe} k\Delta G y_1 \qquad (6a)$$

$$\phi_k = -2\pi k y_1/L_y, \qquad (6b)$$

which uses the Nyquist relation:

$$\Delta G = \frac{1}{\gamma t_{pe} L_y} \qquad (7)$$

This then is the phase of the control data.

In order to extract any random phase errors, the phase of the actual data $\phi_k'$, can be monitored by subtracting $\phi_k$. The difference:

$$\Delta\phi_k = \phi_k - \phi_k' \qquad (8)$$

is ideally a constant or deviates from a constant at most a small, random number in nature. Thus, by rotating each view by $\Delta\phi_k$, the received data $\phi_k'$ should be returned to the actual phase relationship $\phi_k$. Thus, by using a reference object with known properties, it is possible to monitor and correct for phase rotations caused by field fluctuations or synthesizer problems.

Looking now in detail to the techniques for removing random phase rotations, the phase of the received signal attributable to the reference object after the Fourier transform by means 60 is expressed as:

$$\phi_k = -2\pi k y_1/L_y \qquad (9)$$

If the actual data have a DC rotation of $\phi_o$, a spurious phase rotation of $\phi_k'$, and a random phase rotation of $\phi_k''$, then the actual phase, $\widetilde{\phi}_k$, will be:

$$\widetilde{\phi}_k = \phi_k + \phi_o + k' + \phi_k''. \qquad (10)$$

The correction in phase to be applied then is:

$$\phi_{kcor} = \phi_k - \widetilde{\phi}_k. \qquad (11)$$

Each view then is multiplied by $\exp(i\phi_{kcor})$, i.e., each view is rotated through $\phi_{kcor}$ radians. As long as the random phase rotation is small, its correction will enhance the image. If the phase of the reference object $\phi_k$ is not encoded in $\phi_{kcor}$, then all phases are rotated to zero. This results in an image which is shifted such that the center of the reference object occurs at the center of the image in the phase encoding direction.

This shifting can be taken advantage of by replacing $y_1$ in Equation (9) with a selected shift, e.g. $\Delta y_s$. This is useful for centering images. It can also be used for image interpolation. For example, the data is transformed with no shift for n points; the data with $\Delta y_s$ shifted for n points is transformed; and the two sets of n points are interleaved to get a 2n image. This is an advantageous interpolation and an alternative to zero padding the initial n points to 2n points and doing the larger transform. This can also be extended to allow oblique imaging of data in two or three dimensions.

Calculating the phase near zero amplitudes is a difficulty which can be overcome in two ways. First, the reference object height $A = A_{min}$ is chosen such that $\pi k A_{min}/L_y = \pi$ for $k = n$. Because $L_y = 2n\Delta y$, $A = 2\Delta y$ as the largest value of A in which no zero crossing occurs in the phase encoding direction. As an alternative, a second reference object with a larger height A may be provided such that one reference has a zero crossing and the other does not.

Having a sufficient signal after the Fourier transform for accurately calculating the phase can be achieved by insurint that the spin density and relaxation time values, $T_1$ and $T_2$, for the reference object are such that the largest signal per unit dimension in the object being imaged is roughly equal to that of the reference object. The peak signal in the object being imaged after the Fourier transform then is at most 2n times that in the reference object. For the value scaled up to $2^{16}$, the signal from the strip will be $2^8$ for $n = 2^7$.

Another way to enhance the signal is to increase the signal from the strip relative to the signal from the examined object by appropriately adjusting the spin density and relaxation times. The signal in the vicinity of the origin can be significantly improved by increasing the height of the reference object from A to mA. However, the signal has increasingly more zero crossings which renders only those regions away from the zero crossings useful. The ratio of the local maximum, l, away from the central peak as a function of m is just m/l for $1 < l < m$.

Another approach is to create $Bm^2$ pixels across and then average over the $m^2$ colums to reduce the noise by a factor of m and improve the phase determinations. Of course, if two strips are used, then the results from each can be averaged, provided the errors from each are on the same order. Otherwise, it is expedient not to average but to take the results of the reference object with the lowest noise level.

Local phase fluctuations $\theta(x, y)$ are another source of variation. Any x-dependent phases can be removed by taking the magnitude of this Fourier transformed signal from Fourier transformed means 60. The magnitude is used to detect a bad view, rather than to correct for phase. The average signal strength is defined by:

$$\overline{S}(\overline{x}, G_{pe}) = \frac{1}{m^2} \sum_{k=1}^{m^2} |S(x_k, G_{pe})|, \qquad (12)$$

where $\overline{x} = x_o$ and $x_o$ is the position of the center of the reference object. If the reference object is too thick, problems are encountered because the signal has different phase contributions at different y positions. The phase contributions from the different y positions can be resolved with a field map which is used to modify the signal. The modified signal is compared with the data after the first Fourier transform without taking the magnitude.

These local phase fluctuations are due to static, gradient, and local field inhomogeneities. For this region, a finite rather than point like reference object (where phase would be measured) is advantageous. For example, an improved signal to noise ratio is achieved. If RF inhomogeneities exist, then the pulses will deviate from $\pi/2$ or $\pi$ pulses. This spatially dependent variation will also modify the comparison of the actual data and the reference object data.

In the preferred embodiment, the amplitude of the signal from each reference object is monitored. If the monitored signal decreases below a threshold level for one of the reference objects, the phase correction obtained from the other reference object is used. If both amplitudes fall below the threshold, the phase is not corrected. Rather, the data is rejected and new data collected or other collected data is interpolated as a replacement therefor.

The signal which the reference object can be expected to produce can be expressed as:

$$\tilde{S}(x, G_{pe}) = \rho_o A \sin c(\pi k A / L_y). \qquad (13)$$

By comparing the expected signal with the actual signal, $\tilde{S}(x, G_{pe})$, a decision to accept or correct the data can be made. In particular, the data is accepted if the difference between the actual and anticipated signals are less than a preselected maximum, $\alpha$ $$||\tilde{S}(x, G_{pe})| - |S(x, G_{pe})|| < \alpha \qquad (14)$$

If the condition of Equation (14) is not met, then an average view is created by averaging the nearest good neighboring views.

Another option is to discard most of the image except the data from one reference object and do an inverse Fourier transform operation back to data space. The same thresholding procedure can be used for $S(t, G_{pe})$ on a point-by-point basis to remove bad data points. In that case, points from surrounding good views could be used to average out those bad points. A difficulty arises if the reference objects are too narrow. Narrow reference objects may cause truncation of the signal caused by bad points which leads to a broadening of the bad points in the time domain. If the reference object is a single pixel thick, one bad point may lead to a whole view being deleted.

When the bad views are determined during data acquisition, the view may be repeated. This would avoid errors associated with interpolation and averaging.

As indicated above, one of the drawbacks to resistance type main magnetics resides in the frequency variations which are attributable to voltage fluctuations. In some instances, these frequency variations may be limited to as little as 30 hertz in a five minute interval, although variations up to 200 hertz in a five minute interval are not uncommon. In a conventional sequence in which the Nyquist frequency is 6.25 kHz, the frequency per pixel is about 50 hertz. Thus, ideal resolution will be achieved only if the frequency fluctuations can be held below 25 hertz. The present technique corrects for both random phase shifts associated with the frequency shift as well as correcting the frequency variations. Random phase fluctuations, on the order of 0.05 radians are associated with the frequency drift. It has been found that averaging over 10 views gives up to about 3% accuracy in phase determination, with a noise of 10% after the transformation by the Fourier transform means 60. To meet this standard, the minimum thickness of one strip should be about $3A_{min}$, with at least 10 useable pixels across.

With this physical configuration of the reference objects, two zero crossings occur before the outer views. This causes regions where the amplitude will lie below the noise threshold. To resolve this problem, a second reference object of thickness $4A_{min}$ is provided which has its zero crossings staggered from those of the first reference object. The phase correction $\phi_{kcor}$ is adjusted for those views past the zero crossing because the vector has changed from positive to negative. Accordingly, an additional phase adjustment is added to the algorithm.

$$\phi_{kcor}' = \phi_{kcor} + l\pi \qquad (15)$$

where l refers to the number of the last zero crossing passed. This addition of $l\pi$ makes knowledge of the exact thickness of the strip important.

To correct the frequency shift, a test for the boundary of the reference object on a view by view basis is made. When the noise is 10–20% of the signal in the worst case, a threshold can be set so that the first point above the threshold is the edge of the reference object. A test in both sides can serve to check on the number of pixels shifted. Once the shift is known, a whole view can simply be shifted back to the correct position by the appropriate amount and the processing continues. This significantly improves resolution on a system which drifts rapidly. Further, if expansion or shifting has occured, this can be corrected by interpolating and shifting back.

With the present invention, the value of the image of the reference object can be standardized. If the standardization is established such that a value for $t_{rep}$ approaches infinity, then any change in $t_{rep}$ could be accounted for in the final image appropriately normalized. For example, if the image of the reference object prior to adjustment gives a spin density level of $\rho'$, and the standard is set for $\rho_o$, then the new value for the spin density will be:

$$\rho_1 = \rho_o(1 - e^{-t_{rep}/T_1}). \qquad (16)$$

where $T_1$ is the longitudinal relaxation time of the reference object. The spin densities for the remainder of the image become $$\rho_1(x) = \rho(x) \frac{\rho_o}{\rho'} (1 - e^{-t_{rep}/T_1}). \qquad (17)$$

It should be pointed out that the longitudinal relaxation time is not a function of x in this normalization.

This equation can be further refined to account sequence variations with $T_1$ and $T_2$ and normalize the reference object data accordingly. If the predicted image varies with $T_1$ and $T_2$, $$\rho' = \rho_o f(T_1, T_2) \qquad (18)$$

then $$\rho_1(x) = \frac{\rho_o}{\rho'} f(T_1(x), T_2(x)) \rho(x). \qquad (19)$$

By adjusting the window and level, the operator can produce an ideal image with specific $\rho$, $T_1$, $T_2$ normalization to $\rho_o$. Other possible solutions could be listed out if other images to compute $T_1$ and $T_2$ are not available.

The accurate determination of $\Delta G_{pe}$ is important in reducing imaging noise levels. Commonly, a search coil and integrator are provided to determine the phase encode gradient values. One way to verify the measured values is to compare the actual data from the reference object with Equation (2). This technique is advantageous because it deals directly with a physical signal from an object and can be done accurately.

Moreover, the coverage of Fourier space from an oscillating wave form can be monitored using Equation (1). To do this using a search coil requires double integration to find all points. Minor variations in the coil angle and response to zero crossings can lead to inaccuracies in the physical measurement and in comparisons from system to system. From the reference object data one can determine whether a non-linear sampling would obtain the best linear coverage in data space.

By way of specific example, a reference object of 0.5 cm by 3 cm by 5 cm is filled with 1.95 liters of 4.4 mM $Cu^{+2}$ and 100 milliliters of 0.256 mM $Mn^{+2}$. The $T_1$ and $T_2$ values for this reference object are about 600 and 250 ms respectively. The size of the reference object is chosen such that the signal in the read direction is nearly flat near the echo and in the phase encoding direction rapidly changing near zero phase encoding. This condition is met by $kA/L=1$, where k is the index away from the echo, A is the dimension of the reference object, and L is the field of view. For $B/L=1/60$, an essentially flat signal near the echo is obtained. For $A/L=1/10$, the signal drops to zero near the tenth view from the echo.

The invention has been described with reference to the preferred embodiments. Obviously, modifications and alterations will occur to those of ordinary skill in the art upon reading and understanding the preceding detailed description. It is intended that the invention be construed as including all such alterations and modifications in so far as they come within the scope of the appended claims or the equivalents thereof.

Having thus described the preferred embodiments, the invention is now claimed to be:

1. A method of magnetic resonance imaging with reduced phase error distortion, the method comprising:
   (a) positioning a subject and a reference in an image region;
   (b) exciting magnetic resonance of magnetic dipoles of at least a portion of the subject and reference which the disposed in the image region;
   (c) causing a phase encode magnetic field gradient in the image region which phase encodes a magnetic resonance signal emanating from the resonating magnetic dipoles of the subject and the reference;
   (d) receiving the phase encoded resonance signal from the resonating magnetic dipoles in the image region;
   (e) rotating the received resonance signal by a phase offset;
   (f) transforming the phase offset rotated received signal;
   (g) determining a phase angle corresponding to the reference from the transformed signal;
   (h) comparing the determined phase angle with a selected phase angle;
   (i) adjusting the phase offset in accordance with the determined and selected phase angle comparisons and repeating steps (e) and (f);
   (j) repeating steps (b) through (i) with each of a plurality of different phase encode gradients and creating an image representation from the transformed signals.

2. A magnetic resonance method with reduced noise and low signal degradation comprising:
   (a) positioning a subject and a reference object in an image region;
   (b) exciting magnetic resonance of selected magnetic dipoles of at least a portion of the subject and reference object which are disposed in the image region;
   (c) causing magnetic field gradients in the image region which encode the resonating magnetic dipoles of the subject and the reference object;
   (d) receiving a resonance signal from the resonating magnetic dipoles in the image region;
   (e) Fourier transforming the received resonance signal;
   (f) determining a magnitude of a portion of the transformed signal attributable to the reference object;
   (g) comparing the determined signal magnitude with a minimum magnitude;
   (h) in response to the determined magnitude failing to exceed the minimum magnitude, discarding the transformed signal and repeating steps (b) through (g) to generate replacement data.

3. A method of magnetic resonance imaging with reduced noise and low signal degradation comprising:
   (a) positioning a subject and a reference object in an image region;
   (b) exciting magnetic resonance of selected magnetic dipoles of at least a portion of the subject and reference object which are disposed in the image region;
   (c) applying a phase encode magnetic field gradient in the image region which phase encodes the resonating magnetic dipoles of the subject and the reference object;
   (d) receiving a resonance signal from the resonating magnetic dipoles in the image region;
   (e) Fourier transforming the received resonance signal;
   (f) repeating steps (b) through (e) with each of a plurality of phase encode gradients that differ by regular phase encode increments;
   (g) determining a magnitude of a portion of each transformed signal attributable to the reference object;
   (h) comparing the determined signal magnitude with a minimum magnitude; and,
   (i) in response to the determined magnitude failing to exceed the minimum magnitude, replacing the transformed signal with less than the minimum magnitude by interpolating transformed signals that have been phase encoded with adjacent phase encode gradients.

4. A method of magnetic resonance imaging comprising:
   (a) positioning a subject and a reference in an image region;
   (b) exciting magnetic resonance of magnetic dipoles of at least a portion of the subject and reference which are disposed in the image region;
   (c) applying at least a phase encode magnetic field gradient in the image region to phase encode a resonance signal emanating from the resonating dipoles of the subject and the reference;

(d) receiving a phase encoded resonance signal from the resonating magnetic dipoles in the image region;

(e) Fourier transforming the received resonance signal to produce a transformed signal which includes a plurality of pixels;

(f) determining a spin density at one or more preselected pixels of the transformed signal which preselected pixels correspond to the reference;

(g) comparing the determined spin density with a preselected spin density of the reference;

(h) adjusting the spin density of all pixels of the Fourier transformed signal in accordance with the comparison;

(i) repeating steps (b) through (h) a plurality of times with each of a plurality of phase encode gradients; and, (j) creating an image representation from the plurality of spin density adjusted transformed signals.

5. A method of magnetic resonance imaging with subject motion compensation, the method comprising:

(a) positioning a subject with a reference in an image region, the reference moving with a moving region of the subject;

(b) exciting magnetic resonance of magnetic dipoles of at least a portion of the subject and reference which are disposed in the image region;

(c) applying at least a phase encode magnetic field gradient in the image region to phase encode the resonating dipoles of the subject and the reference;

(d) receiving a resonance signal from the resonating magnetic dipoles in the image region, which resonance signal is phase encoded in accordance with the applied phase encode gradient;

(e) transforming the received resonance signal;

(f) determining a spatial position of the reference object from the transformed signals;

(g) comparing the determined spatial position of the reference object with a reference position;

(h) scaling a spatial dimension represented by a transformed signal in accordance with the comparison; and, (i) repeating steps (b) through (h) a plurality of times with each of a plurality of phase encode gradients and combining the scaled transformed signals to produce an image representation.

6. A method of magnetic resonance imaging comprising:

(a) positioning a subject with a reference in an image region, the reference having a known value of at least one preselected parameter;

(b) exciting magnetic resonance of magnetic dipoles of at least a portion of the subject and reference which are disposed in the image region;

(c) applying at least one of a plurality of phase encode magnetic field gradients in the image region to phase encode a magnetic resonance signal from the resonating dipoles of the subject and the reference;

(d) receiving the resonance signal which is phase encoded in accordance with the applied phase encode gradient;

(e) transforming the received resonance signal into a representation of spatial position and density of the resonating dipoles;

(f) measuring a value of the preselected parameter in a portion of the representation which corresponds to the reference;

(g) comparing the measured parameter value with a selected value to determine a deviation therebetween;

(h) compensating for the deviation between the measuring and selected values by at least one of (1) altering the representation and (2) altering the received resonance signal and transforming the altered resonance signal, such that an altered representation is produced; and, (i) repeating steps (b) through (h) with each of a plurality of phase encode gradients and combining the altered representations to form an image.

7. A magnetic resonance image method comprising:

(a) positioning a selected region of a subject in an image region;

(b) selecting a subregion of the selected subject region as a reference;

(c) creating a substantially uniform main magnetic field in the image region;

(d) exciting magnetic resonance of selected magnetic dipoles which are disposed in the image region to generate a resonance signal;

(e) causing magnetic field gradients in the image region which phase encode the resonance signal;

(f) receiving phase encoded resonance signal from the resonating magnetic dipoles in the image region;

(g) transforming the phase encoded resonance signal into a representation of spatial position and spin density of resonating dipoles;

(h) determining an apparent spatial position of the selected subregion from the representation;

(i) comparing the determined position of the selected subregion with a reference position;

(j) rotating the phase encode angle of the received resonance signals in accordance with the position comparison;

(k) repeating steps (d) through (j) with each of a plurality of different phase encode gradient; and, (l) transforming the phase rotated resonance signals into an image representation.

8. A magnetic resonance imaging apparatus comprising:

means for supporting in an image region a subject and a reference object which reference object has a known value of at least one of a plurality of preselected parameters;

a main magnetic field means for creating a generally uniform main magnetic field through the image region;

a magnetic resonance excitation means for exciting magnetic resonance of magnetic dipoles in the subject and reference objects in the image region;

a magnetic field gradient means for causing each of a plurality of magnetic field gradients across the main magnetic field in the image region at least for phase encoding resonance signals from the resonating dipoles with each of a plurality of phase encode gradients;

a receiving means for receiving each phase encoded magnetic resonance signal;

a transforming means for transforming each received, phase encoded resonance signal into a representation of spatial position and density of the resonating magnetic dipoles;

a measuring means for measuring a value of the preselected parameter from a portion of the representation corresponding to the reference object;

a comparing means for comparing the measured parameter value with a selected parameter value to determine a deviation therebetween;

an altering means for altering at least one of the received phase encoded resonance signal and the representations from a plurality of differently phase encoded resonance signals to form an image representation.

* * * * *